(12) United States Patent
Rault et al.

(10) Patent No.: US 6,323,718 B1
(45) Date of Patent: Nov. 27, 2001

(54) NORMALLY-ON BIDIRECTIONAL SWITCH

(75) Inventors: Pierre Rault, Saint Cyr sur Loire; Eric Bernier, Mettray, both of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/209,381

(22) Filed: Dec. 10, 1998

(30) Foreign Application Priority Data

Dec. 22, 1997 (FR) .................................................. 97 11640

(51) Int. Cl.[7] .................................................. H03K 17/72
(52) U.S. Cl. ........................ 327/438; 327/439; 327/441
(58) Field of Search ................................... 327/438, 439, 327/440, 441, 442, 445, 446, 449

(56) References Cited

U.S. PATENT DOCUMENTS

| | | | |
|---|---|---|---|
| 3,818,247 | * 6/1974 | Chambers et al. | 327/449 |
| 4,058,741 | 11/1977 | Tokunaga et al. | 327/450 |
| 4,424,544 | * 1/1984 | Chang et al. | 361/56 |
| 4,825,272 | 4/1989 | Lehmann | 357/38 |
| 4,956,599 | 9/1990 | Nishizawa et al. | 323/244 |
| 5,491,385 | * 2/1996 | Nilssen | 315/178 |
| 6,160,439 | * 12/2000 | Abe et al. | 327/438 |

FOREIGN PATENT DOCUMENTS

| | | | |
|---|---|---|---|
| A-0 785 577 | 7/1997 | (EP) | H01L/27/02 |
| A-0 793 344 | 9/1997 | (EP) | H03K/17/72 |

OTHER PUBLICATIONS

Robert D.Pascoe, Fundamentals of Solid–State Electronics( pp. 266–267), 1976.*
Robert L. Shrader, Electronic communication ( p. 194), 1975.*
French Search Report from French Patent Application 97 16640, filed Dec. 22, 1997.
R. Pospisil: "A 500V Dielectric Process For Very High Voltage Integrated Circuits" Electro /86 and Mini/ Macro Northeast Conference Record, vol. 11, Dec. 1, 1986, Los Angeles, US, pp 1–7.

* cited by examiner

*Primary Examiner*—Tuan T. Lam
*Assistant Examiner*—Hiep Nguyen
(74) *Attorney, Agent, or Firm*—Wolf, Greenfield & Sacks, P.C.; James H. Morris

(57) ABSTRACT

The present invention relates to a normally-on bidirectional switch, including, in parallel between two power terminals of the switch, a first cathode-gate thyristor, the anode of which is connected to a first power terminal, a second anode-gate thyristor, the anode of which is connected to a second power terminal, and a resistor in series with a controllable switch, the midpoint of this series association being connected to the respective gates of the two thyristors. The present invention also provides a monolithic integration of the switch.

31 Claims, 4 Drawing Sheets

NORMALLY-ON BIDIRECTIONAL SWITCH

BACKGROUND OF THE INVENTION

1. Field of the Invention

The present invention relates to bidirectional switches for controlling a load connected to the mains. The present invention more specifically applies to "normally-on" switches, that is, switches which are spontaneously in the on-state (i.e., conducting) and the control of which includes opening the switch to block (i.e., disconnect) the load supply.

2. Discussion of the Related Art

FIG. 1 shows a first example of a normally-on bidirectional switch 1. Switch 1 is essentially formed of a triac 11 connected between two power terminals 12, 13. Gate G of triac 11 is connected, via a controllable switch 14, to a first power terminal 12 or first anode A1 of triac 11. A resistor R1 of high value connects gate G of triac 11 to a second power terminal 13 or second anode A2 of the triac, so that the series association of resistor R1 and of switch 14 is connected in parallel on triac 11.

Switch 1 is meant to be connected in series with a load 15 (Q) between two terminals 16, 17 of application of an a.c. supply voltage Vac, for example, the mains voltage.

Control switch 14 can be a manual control switch or receive a control signal CTRL provided by an appropriate control circuit.

The operation of a switch such as shown in FIG. 1 is the following. It is assumed that, at rest, switch 14 is open. When a voltage is applied across switch 1, that is, when an a.c. voltage is applied between terminals 16 and 17, a current flows in gate G of triac 11 through resistor R1 and triggers the triac which remains on as long as it conducts a current, that is, until the zero crossing of the a.c. voltage. This process is repeated for each halfwave of the a.c. supply voltage Vac. For example, at the beginning of a positive halfwave, a current flows from terminal 13 through resistor R1, and from gate G to anode A1 of triac 11, until this current is sufficient to trigger the triac in the first quadrant (positive gate and anode currents). Once triac 11 has been triggered, the current flows therethrough until the end of the halfwave, where the triac turns off. At the beginning of a negative halfwave, a current flows, from terminal 12, from anode A1 to gate G of triac 11 and through resistor R1, until this current is sufficient to trigger the triac in the third quadrant (negative anode and gate currents).

Resistor R1 is sized according to the gate current required to trigger the triac and to the maximum acceptable supply voltage (generally on the order of 20 volts) to turn on switch 1 at the beginning of each halfwave. When switch 14 is closed (by an action exterior to switch 1), gate G and anode A1 of the triac are short-circuited and the triac can no longer trigger and remains in the off-state.

A disadvantage of a switch such as shown in FIG. 1 is that, when the triac is maintained in the off-state (switch 14 being closed), resistor R1 dissipates a high power. Indeed, the triggering current of a triac is relatively high, which does not allow use of a high resistance R1 while respecting the imperative of a low voltage triggering which characterizes a normally-on switch. Presently, the triacs which are most sensitive at the triggering require a gate current of several mA. This high triggering current is linked to the structure of a triac. A sufficiently high triggering current to avoid that the residual non-recombined loads in the semiconductor cause a restarting of the triac at halfwave ends must indeed be provided.

For example, among the most sensitive triacs manufactured by SGS-THOMSON Microelectronics, the triacs known under denomination Z0103 and Z0402 require a gate current of 3 mA to be triggered.

With such a minimum gate current value and for a triggering voltage of 20 volts, a resistance R1 on the order of 7 kΩ has to be provided. This results in a dissipated power on the order of 6 watts when switch 14 is closed and when voltage Vac is the 220 V mains voltage.

The implementation of a normally-on bidirectional switch in which the dissipated power is substantially lower than with the switch of FIG. 1 has already been provided. FIG. 2 shows an example of such a normally-on bidirectional switch 2, connected in series with a load 25 between two terminals 26, 27 of application of an a.c. supply voltage Vac.

As previously, a triac 21 is connected between two power terminals 22, 23 of switch 2 to which are respectively connected a terminal (for example, 27) of application of the supply voltage and a first terminal of load 25. Gate G of triac 21 is connected to an a.c. input of a diode bridge 28, the other a.c. input of which is connected to terminal 23, and thus to an anode (for example, A2) of triac 21. A resistor R2, in series with a switch 24 of control of switch 2, is connected between the (+) and (−) rectified voltage terminals of bridge 28. A thyristor 29 is connected in parallel to the series association of resistor R2 and switch 24, its anode being connected to the positive rectified voltage terminal (+) of bridge 28 and its cathode being connected to the negative terminal (−). The gate of thyristor 29 is connected to the connection node of resistor R2 and switch 24.

The operation of switch 2 shown in FIG. 2 is the following.

It is assumed that switch 24 is open. At the beginning of a positive halfwave, a current flows, from terminal 23, through a first diode of bridge 28, resistor R2, the gate and the cathode of thyristor 29, the diode of bridge 28 opposite to the first one, then from gate G to anode A1 of triac 21. As soon as the current reaches the value required to trigger thyristor 29, the latter turns on. Afterwards, as soon as the current flowing through thyristor 29 becomes sufficient to trigger triac 21, the latter triggers, thus short-circuiting all other components of switch 2. At the beginning of a negative halfwave, a current flows from terminal 22, from anode A1 to the gate of triac 21, through a third diode of bridge 28, from the cathode to the gate of thyristor 29, through resistor R2, then through a diode of bridge 28 opposite to the third one. As previously, switch 2 is triggered in two steps, by the turning-on of thyristor 29 short-circuiting resistor R2 and switch 24, then by the turning-on of triac 21.

A thyristor 29 is used in order to provide a component that is more sensitive to triggering than a triac. Indeed, it is known to implement thyristors (with a cathode-gate), having triggering current on the order of some hundred $\mu A$, or even less. Accordingly, resistor R2 can be sized with a much higher value than in the switch shown in FIG. 1. As a result, when switch 24 is closed to prevent the triggering of thyristor 29 by short-circuiting its gate and its cathode, the power dissipated in switch 2 is much lower.

As a specific example, assuming that thyristor 29 has a triggering current of 100 $\mu A$ and taking, as a triggering voltage, the same value as previously (that is, 20 volts), resistor R2 can have a value on the order of 200 kΩ. As a result, the dissipated power when switch 24 is on is on the order of 100 mW.

If such a switch overcomes the dissipated power disadvantage of the switch of FIG. 1, it however has some disadvantages.

A first disadvantage is that it requires a high number of components due to the presence of diode bridge 28. Further, all these components have to withstand the high a.c. supply voltage (for example, approximately 220 volts).

Another disadvantage is that switch 24 is not referenced to a.c. supply voltage Vac but to the negative rectified voltage terminal of bridge 28. This makes the control of switch 24 more complex and limits the applications in which such a switch can be used. Indeed, a control circuit isolated from the mains then has to be used (a power supply with a transformer or using an optocoupler). This prevents the use of the same control circuit to control several switches.

SUMMARY OF THE INVENTION

The present invention aims at overcoming the disadvantages of known normally-on bidirectional switches.

The present invention more specifically aims at providing a novel normally-on bidirectional switch which has low power dissipation in the off state and which requires relatively few components.

The present invention also aims at having the bidirectional switch use a control switch referenced to the a.c. supply voltage.

The present invention also aims at providing structures of monolithic components integrating at least the thyristors of the circuit according to the present invention.

A characteristic of the present invention is to provide a switch using two thyristors respectively associated with the positive and negative halfwaves of the a.c. supply voltage. Another characteristic of the present invention is to use the same resistor to trigger each of these thyristors at the beginning of the positive or negative halfwave associated therewith.

More specifically, the present invention provides a normally-on bidirectional switch, including, in parallel between two power terminals of the switch, a first cathode-gate thyristor, the anode of which is connected to a first power terminal; a second anode-gate thyristor, the anode of which is connected to a second power terminal; and a resistor in series with a controllable switch, the midpoint of this series association being connected to the respective gates of the two thyristors.

According to an embodiment of the present invention, the thyristors are chosen to have a low triggering current.

According to an embodiment of the present invention, a protection diode is interposed between the cathode of the anode-gate thyristor and the first power terminal.

According to an embodiment of the present invention, the resistor is of high value, chosen according to the respective triggering currents of the thyristors.

According to an embodiment of the present invention, at least both thyristors are integrated.

According to an embodiment of the present invention, at least both thyristors, the protection diode, and the resistor are integrated within the same circuit.

According to an embodiment of the present invention, the resistor is non-linear.

The present invention also provides a monolithic semiconductor component integrating the two thyristors of the above-mentioned bidirectional switch in which the thyristors are implemented in vertical form in a portion of a lightly-doped N-type substrate surrounded with a P-type isolating wall.

According to an embodiment of the present invention, the anode of the anode-gate thyristor and the cathode of the cathode-gate thyristor are arranged on the rear surface side of the component coated with a single metallization, the gate of the cathode-gate thyristor is taken on the isolating wall on the front surface side of the component, and the anode gate of the anode-gate thyristor is formed of a ring surrounding a P-type well in which is formed a cathode layer of the component, on the front surface side.

According to an embodiment of the present invention, the anode of the cathode-gate thyristor and the cathode of the anode-gate thyristor are arranged on the rear surface side of the component coated with a single metallization, the gate of the anode-gate thyristor is formed of a ring surrounding a P-type well forming the anode region of the thyristor, and the gate metallization M of the cathode-gate thyristor is formed on the upper surface side of the substrate on a P-type well containing an N-type region forming the cathode of the cathode-gate thyristor.

According to an embodiment of the present invention, the anode of the cathode-gate thyristor and the cathode of the anode-gate thyristor are arranged on the rear surface side of the component and coated with a single metallization, the gate of the anode-gate thyristor is of remote gate type and is formed of an N-type region formed in the anode well of the anode-gate thyristor, whereby the anode-gate thyristor is protected against overvoltages resulting from high reverse voltages, and the gate metallization M of the cathode-gate thyristor is formed on the upper surface side of the substrate on a P-type well containing an N-type region forming the cathode of the cathode-gate thyristor.

According to an embodiment of the present invention, the component includes a lightly-doped P-type region extending between the P-type well in which the cathode region of the cathode-gate thyristor is formed and the isolating wall, whereby this region forms a resistor arranged between the gate of the anode- and cathode-gate thyristors and the anode of the cathode-gate thyristor and the cathode of the anode-gate thyristor.

The foregoing objects, features and advantages of the present invention, will be discussed in detail in the following non-limiting description of specific embodiments in connection with the accompanying drawings.

DETAILED DESCRIPTION

Figure 3:
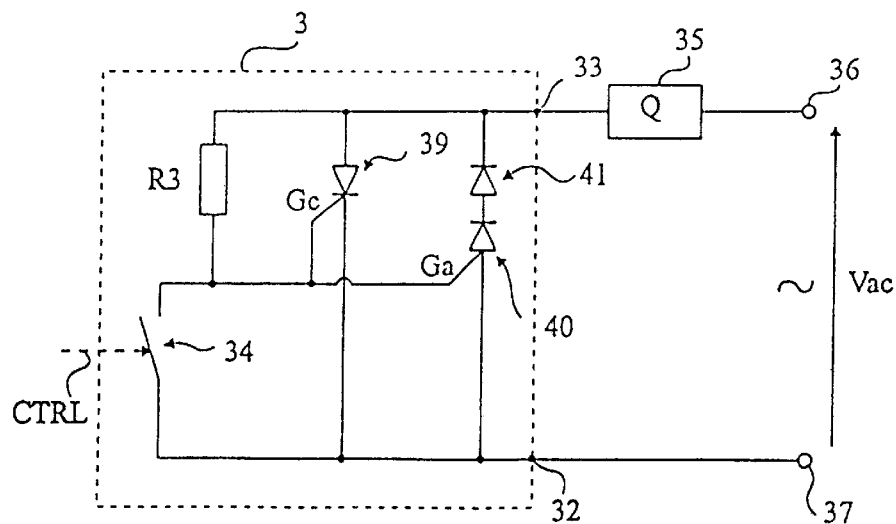
FIG. 3 shows an embodiment of a normally-on bidirectional switch according to the present invention.

FIG. 3 shows an embodiment of a normally-on bidirectional switch 3 according to the present invention. Switch 3 is meant, as with a conventional switch, to be connected in series with a load 35 (Q) between two terminals 36, 37 of application of an a.c. supply voltage Vac, for example, the mains voltage. Switch 3 includes, as previously, two power terminals 32, 33, meant to be connected, respectively, to a terminal of application of the a.c. supply voltage and to a terminal of load 35.

According to the present invention, switch 3 includes, in parallel between power terminals 32 and 33, a first cathode-gate thyristor 39, the anode of which is connected to a first power terminal (for example, 33), and a second anode-gate thyristor 40, the anode of which is connected to the other power terminal (for example, 32). The respective gates Gc and Ga of thyristors 39 and 40 are connected, via a same resistor R3, to terminal 33 and, via a control switch 34, to terminal 32.

Control switch 34 may be a manual control switch or a switch operated by a control signal CTRL coming from an appropriate circuit. For example, switch 34 may be a bipolar transistor associated with an optocoupler.

The operation of a switch 3 according to the present invention is the following.

Switch 34 is assumed to be open. At the beginning of a positive halfwave of a.c. supply voltage Vac, a current flows, from terminal 33, through resistor R3, then from gate Gc to the cathode of thyristor 39. When this current becomes higher than the triggering current of thyristor 39, the latter triggers. Thyristor 39 turns off at the end of the halfwave as the current flowing therethrough disappears. At the beginning of a negative halfwave, a current flows, from terminal 32, from the anode to the gate Ga of thyristor 40, then through resistor R3. When this current becomes higher than the triggering current of thyristor 40, the latter turns on.

A closing of control switch 34 short-circuits gate Gc and the cathode of thyristor 39, and gate Ga and the anode of thyristor 40. Accordingly, both thyristors 39 and 40 are maintained in the off state.

Preferably, a protection diode 41 is interposed between the cathode of thyristor 40 and terminal 33. The function of this diode 41 is to protect thyristor 40 when it is reverse-biased. The usefulness of diode 41 is linked to the conventional structure of the anode-gate thyristor and, especially, to the breakdown voltage of the junction between the gate and the cathode of thyristor 40 which, as will be seen hereafter, is a junction with a low reverse breakdown voltage. In the absence of diode 41, the voltage would not be withstood when +V is applied on terminal 33 and −V is applied on terminal 32.

For thyristor 39, such a protection diode is not necessary. Indeed, the gate-anode junction withstands the voltage during positive halfwaves.

An advantage of the present invention is that by exclusively using thyristors as the active power switching components, advantage is taken from the high sensitivity of thyristors with respect to triacs.

Another advantage of the present invention is that switch 34 is now referenced to the a.c. supply voltage.

Figure 1:
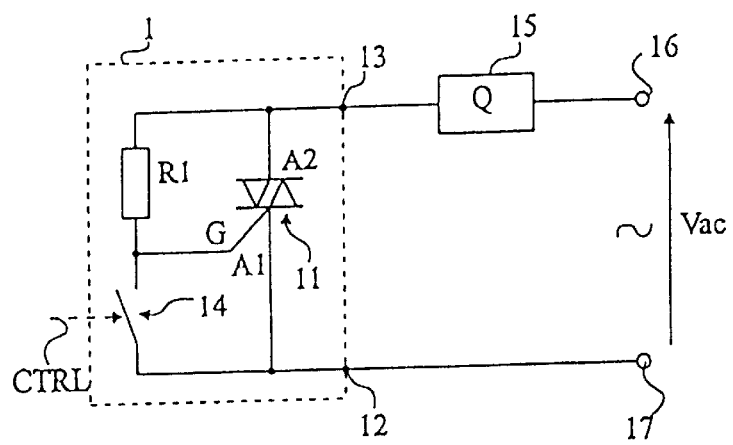
FIGS. 1 and 2, previously described, are meant to show the state of the art and the problem to solve.
Figure 2:
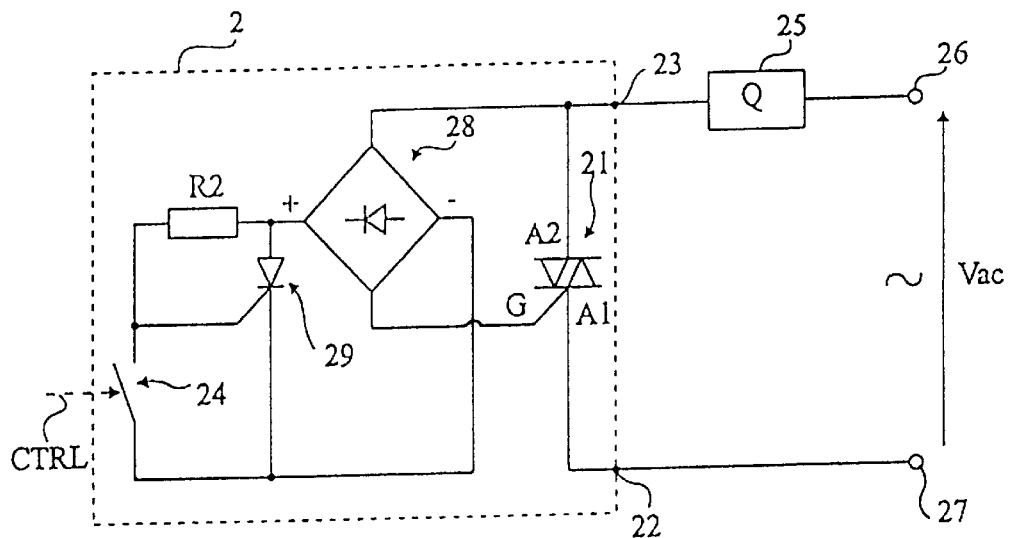

Another advantage of the present invention is that it reduces or minimizes the number of high voltage components required with respect to a conventional switch such as illustrated by FIG. 2.

Another advantage of the present invention is that the low triggering current of the switch allows the use of low voltage switches due to the high value of resistor R3. For example, a low voltage bipolar or MOS transistor, a microrelay, an optocoupler, etc. may be used.

As a specific example of implementation, thyristors having gate currents on the order of 100 $\mu$A may be used. In this case, the resistor can have a value on the order of 200 k$\Omega$, which results in a dissipated power on the order of 100 mW when switch 34 is closed.

In the form of an integrated circuit, resistor R3 may be a resistor which is not linear in voltage (with a positive coefficient), that is, the value of which increases with the voltage thereacross. An advantage then is that the dissipated power is reduced or minimized without adversely affecting the triggering capacity of the thyristors at the beginning of each halfwave.

Based on the solution provided by the present invention, it could be considered to use two cathode-gate thyristors connected in antiparallel instead of the cathode-gate thyristor and the anode-gate thyristor. Such a solution would however not have all the advantages of the present invention. Indeed, this would imply a more complex control circuit, thus increasing the number of necessary components. For example, two resistors respectively associated with the gates of the thyristors, as well as two switches to open the switch, would then have to be used.

Figure 4:
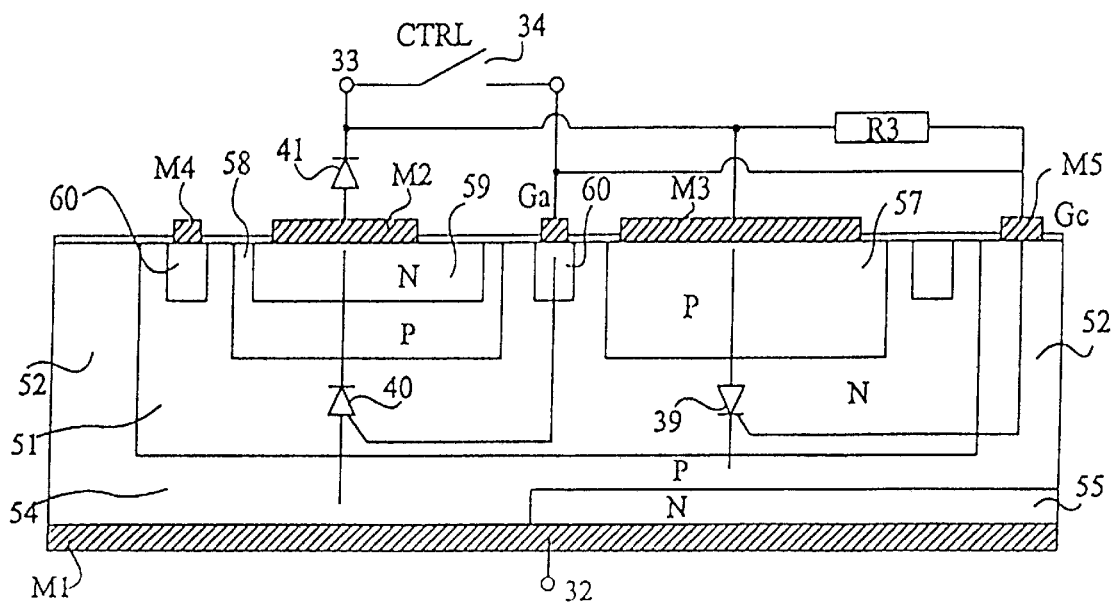
FIGS. 4 to 7 show various embodiments of monolithic assemblies incorporating at least the two thyristors of the circuit according to the present invention.

FIG. 4 shows a first example of a monolithic assembly of the two thyristors 39 and 40. Both thyristors are vertical thyristors formed in a same lightly-doped N-type silicon substrate 51. This substrate, or the substrate portion in which are formed the thyristors, is delimited by a heavily-doped P-type isolating wall 52. The rear surface of the structure comprises a P-type region 54 in which is formed, on the right-hand side of the drawing, a heavily-doped N-type region 55. The rear surface of the structure is coated with a metallization M1.

On the front surface side are formed two P-type wells 57 and 58, well 57 facing rear surface N-type region 55. In well 58 is formed an N-type region 59. A heavily-doped N-type region 60 is formed in the substrate at the periphery of well 58. A metallization M2 is formed on region 59, a metallization M3 is formed on region 57, a metallization M4 is formed on region 60, and a metallization M5 is formed on isolating wall 52, on the right-hand side of the drawing. A cathode-gate thyristor 39, the anode of which corresponds to region 57 and the cathode of which corresponds to region 55 has thus been formed. Metallization M5 corresponds to the gate metallization of thyristor 39. An anode-gate thyristor 40, the anode of which corresponds to layer 54 and the cathode of which corresponds to region 59 has thus been formed. Metallization M4 forms the gate metallization of thyristor 40. The drawing also shows how the thyristors are connected to the components described in relation with FIG. 3. It should be noted that, in this embodiment, diode 41 is formed outside of the monolithic component. It should also be noted that it can also be formed in this same component outside the region defined by isolating wall 52, by using, for example, techniques of assembly of power components such as described by the applicant in European patent application 721218 entitled "circuits intégrés de puissance", which application is incorporated herein by reference.

Figure 5:
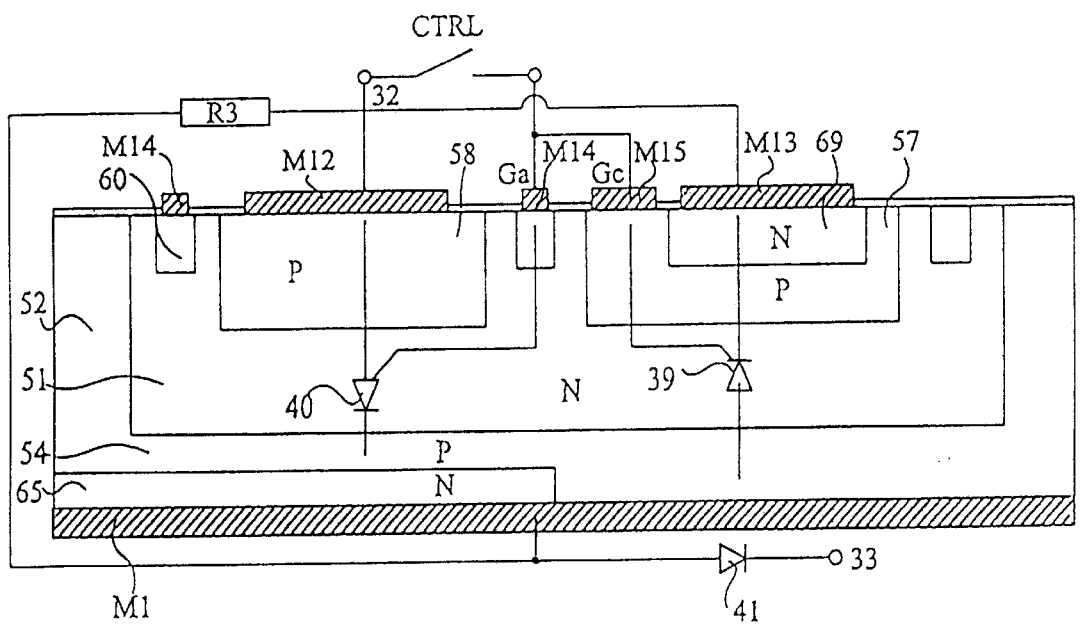

FIG. 5 shows another embodiment of a thyristor assembly according to the present invention. In this case, the anode of anode-gate thyristor 40 and the cathode of cathode-gate thyristor 39 are on the upper surface side of the component.

As in the preceding drawing, a portion of a lightly-doped N-type substrate 51 is defined by a P-type isolating wall 52. The rear surface comprises a P-type uniform layer 54. This time, an N-type region 65 formed from the lower surface is located on the left-hand side of the drawing (the side of the anode-gate thyristor). Well 57 of cathode-gate thyristor 39 contains a heavily-doped N-type region 69 while anode well 58 of the anode-gate thyristor contains no N layer. As previously, well 58 is surrounded with a heavily-doped N-type region 60. As previously, there is a rear surface metallization M1. A metallization M12 covers anode region 58 of thyristor 40. A metallization M13 covers cathode region 69 of thyristor 39. A metallization M14 covers N-type ring 60. The gate of cathode-gate thyristor 39 is formed on a portion of well 57 and is designated with reference M15.

This is an alternative implementation of the structure according to the present invention. It has, with respect to the former one, the advantage that the cathode-gate thyristor is more sensitive, that is, it will trigger for a lower gate current while anode-gate thyristor 40 is slightly less sensitive.

Figure 6:
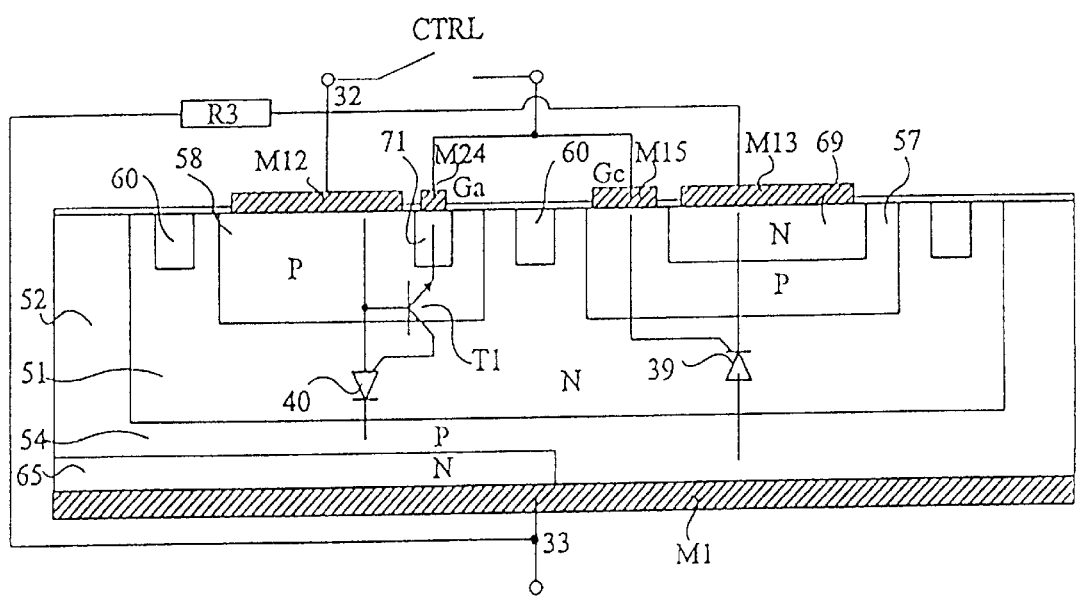

FIG. 6 shows another embodiment of the present invention. The layer structure of this embodiment is substantially identical to that of FIG. 5. Same regions will be referred to by same references and will not be described again. The difference between the structures of FIGS. 6 and 5 is that, in FIG. 6, there no longer is a metallization on ring 60, this ring then only having a conventional channel stop function. Gate metallization M24 of the anode-gate thyristor is made on a P-type region 71 formed in anode well 58 of thyristor 40. A so-called "remote gate" thyristor structure is thus obtained. The triggering of the thyristor is started by a small transistor T1 formed of regions 71, 58, and 51, connected to thyristor 40 as illustrated in FIG. 6. The advantage of this structure is that thyristor 40 is then self-protected in case of the presence of a high positive voltage on rear surface metallization M1. Diode 41 then is an integral part of the structure and corresponds to the junction between regions 58 and 51, this diode having, as previously indicated, the function of protecting the anode-gate thyristor from a parasitic reverse triggering between the gate and the anode when the cathode is at a high positive voltage.

Figure 7:
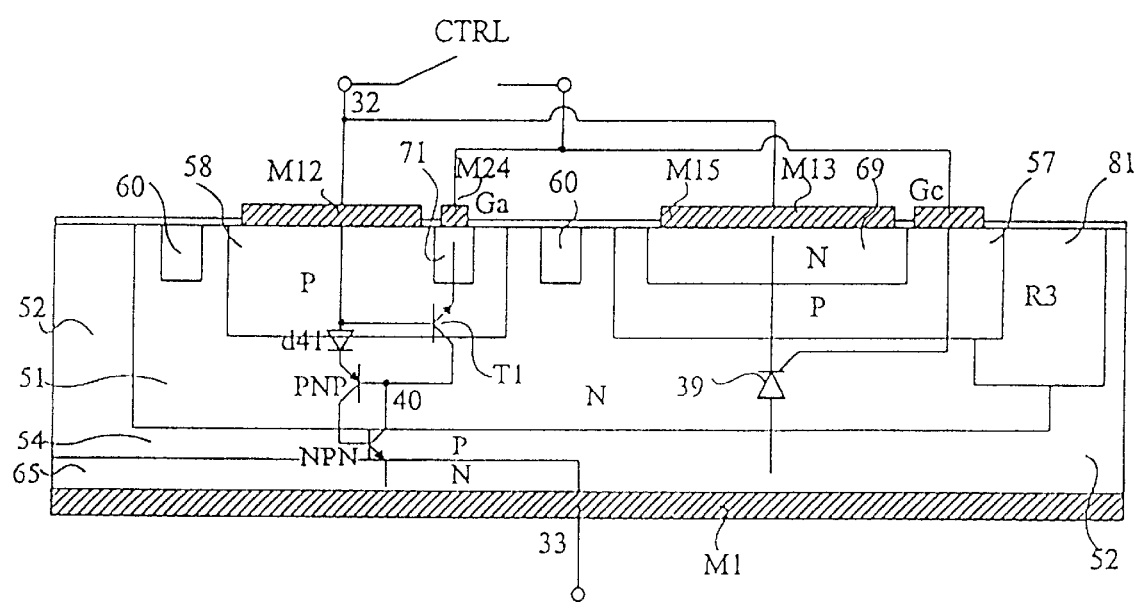

FIG. 7 shows another embodiment of the present invention.

This embodiment is generally identical to that illustrated in FIG. 6 and same elements are referred to by same references. On the left-hand side of the drawing, thyristor 40 has been represented by equivalent transistors to better show diode d41 performing the function of diode 41 of the circuit of FIG. 3. In addition to the regions and layers shown in FIG. 6, the structure of FIG. 7 comprises a lightly-doped P-type region 81 which extends between well 57 and isolating wall 52. In other words, region 81 extends between the gate of thyristor 39 and metallization MI common to the anode of thyristor 39 and the cathode of thyristor 40. It thus performs the function of resistor R3 of FIG. 3. Thus, all elements of bidirectional switch 3 of FIG. 3 are integrated in the structure of FIG. 7, except for controllable switch 34. However, as has been previously indicated, those skilled in the art may implement this switch in the same monolithic component by using the previously indicated techniques.

Thus, FIG. 7 shows a monolithic structure integrating a normally-on bidirectional switch according to the present invention. Those skilled in the art will know how to choose the dimensions and doping levels of the various layers to reach the objects aimed at in terms of power and triggering sensitivity.

Of course, the present invention is likely to have various alterations, modifications, and improvements which will readily occur to those skilled in the art. In particular, the voltage and sensitivity characteristics of the cathode-gate and anode-gate thyristors, as well as the value of resistance R3, will be adapted to the application for which the switch is meant. Further, it should be noted that the present invention may also be used to implement a normally-off switch. For this purpose, it is enough to eliminate resistor R3 and switch 34, and to provide a control circuit injecting a gate current during on periods.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A normally-on bidirectional switch, including, in parallel between two power terminals of the switch:

a cathode-gate thyristor having a gate and an anode, the anode of the cathode-gate thyristor being connected to a first power terminal of the two power terminals;

an anode-gate thyristor having a gate and an anode, the anode of the anode-gate thyristor being connected to a second power terminal of the two power terminals; and a series association of a resistor electrically coupled in series with a controllable switch, a midpoint of the series association being connected to the gate of the cathode-gate thyristor and to the gate of the anode-gate thyristor, the gate of the cathode-gate thyristor being distinct from the gate of the anode gate thyristor.

2. The switch of claim 1, wherein the cathode-gate thyristor and the anode-gate thyristor are each chosen to have a low triggering current.

3. The switch of claim 1, wherein the anode-gate thyristor has a cathode, the switch further comprising:

a protection diode interposed between the cathode of the anode-gate thyristor and the first power terminal.

4. The switch of claim 1, wherein the resistor has a high resistance that is selected as a function of a triggering current of the cathode-gate thyristor and the anode-gate thyristor.

5. The switch of claim 1, wherein at least the cathode-gate thyristor and the anode-gate thyristor are integrated.

6. The switch of claim 3, wherein at least the cathode-gate thyristor, the anode-gate thyristor, the protection diode, and the resistor are integrated within a same circuit.

7. The switch of claim 6, wherein the resistor is non-linear.

8. A switch, comprising:

a first terminal;

a second terminal;

a cathode-gate thyristor having a gate, a cathode, and an anode, the anode of the cathode-gate thyristor being connected to the first terminal, and the cathode of the cathode-gate thyristor being connected to the second terminal;

an anode-gate thyristor having a gate, a cathode, and an anode, the anode of the anode-gate thyristor being connected to the second terminal, and the cathode of the anode-gate thyristor being electrically coupled to the first terminal; and a series association of a resistor and a controlled switch connected between the first terminal and the second terminal, the series association having a midpoint between the resistor and the controlled switch;

wherein the gate of the cathode-gate thyristor is connected to the gate of the anode-gate thyristor and the midpoint of the series association, the gate of the cathode-gate thyristor being distinct from the gate of the anode gate thyristor.

9. The switch of claim 8, wherein the switch conducts current in a first direction from the first terminal to the second terminal and in a second direction from the second terminal to the first terminal.

10. The switch of claim 8, wherein the controlled switch includes a manually controlled switch.

11. The switch of claim 8, wherein the controlled switch includes an electronically controlled switch.

12. The switch of claim 11, wherein the electronically controlled switch receives an alternating current voltage potential.

13. The switch of claim 11, wherein the electronically controlled switch includes a low-voltage electronically controlled switch.

14. The switch of claim 11, wherein the electronically controlled switch includes at least one of a bipolar transistor, a MOS transistor, a microrelay, and an optocoupler.

15. The switch of claim 8, wherein the cathode-gate thyristor and the anode-gate thyristor each have a triggering current of approximately 100 µA.

16. The switch of claim 15, wherein the resistor has a resistance of approximately 200 KΩ.

17. The switch of claim 8, further comprising:
  a diode, connected between the cathode of the anode-gate thyristor and the first terminal, that electrically couples the cathode of the anode-gate thyristor to the first terminal.

18. The switch of claim 8, wherein the cathode-gate thyristor conducts current when a voltage potential of the first terminal is greater than a voltage potential of the second terminal, and wherein the anode-gate thyristor conducts current when the voltage potential of the second terminal is greater than the voltage potential of the first terminal.

19. The switch of claim 8, wherein a current through the resistor triggers the anode-gate thyristor during a first period of an alternating current voltage and triggers the cathode-gate thyristor during a second period of the alternating current voltage when the first and second terminals of the switch are electrically coupled to an alternating current voltage supply.

20. The switch of claim 8, wherein the switch dissipates approximately 100 mW when the controlled switch is closed.

21. The switch of claim 8, wherein the resistor includes a non-linear resistor.

22. The switch of claim 8, wherein the resistor includes a non-linear resistor having a resistance that increases with a voltage across the non-linear resistor.

23. A method of controlling power to a load using a two-state switch having a first state in which power is supplied to the load and a second state in which power is not supplied to the load, the switch having first and second switch terminals and the load and the switch being electrically coupled in a series between supply terminals of an alternating current voltage supply, the method comprising acts of:
  a) providing a first triggering current to a gate of a first thyristor when the first switch terminal has a voltage potential that is greater than a voltage potential of the second switch terminal, and triggering, in response to receiving the first triggering current, the first thyristor to provide a low impedance path between the first switch terminal and the second switch terminal when the switch has the first state;
  b) providing a second triggering current to a gate of a second thyristor that is distinct from the gate of the first thyristor when the voltage potential of the second switch terminal is greater than the voltage potential of the first switch terminal, and triggering, in response to receiving the second triggering current, the second thyristor to provide a low impedance path between the second switch terminal and the first switch terminal when the switch has the first state; and
  c) preventing the triggering of the first thyristor and the second thyristor when the switch has the second state.

24. The method of claim 23, wherein the acts of providing the first triggering current and providing the second triggering current include an act of dropping a voltage across a same resistor.

25. The method of claim 24, wherein the act of preventing includes an act of dissipating only approximately 100 mW when the alternating current voltage supply is a 220 volt alternating current voltage supply.

26. The method of claim 25, further comprising an act of increasing a resistance of the same resistor in response to an increase in voltage provided by the alternating current supply.

27. The method of claim 26, further comprising an act of preventing a breakdown of the second thyristor when the voltage potential of the first switch terminal is greater than the voltage potential of the second switch terminal and the switch has the first state.

28. The method of claim , wherein the acts of providing the first triggering current and providing the second triggering current include acts of providing first and second triggering currents of approximately 100 µA.

29. The method of claim 24, further comprising an act of increasing a resistance of the same resistor in response to an increase in voltage provided by the alternating current supply.

30. The method of claim 23, further comprising an act of preventing a breakdown of the second thyristor when the voltage potential of the first switch terminal is greater than the voltage potential of the second switch terminal and the switch has the first state.

31. The method of claim 23, wherein the acts of providing the first triggering current and providing the second triggering current include acts of providing first and second triggering currents of approximately 100 µA.

* * * * *

UNITED STATES PATENT AND TRADEMARK OFFICE
CERTIFICATE OF CORRECTION

PATENT NO. : 6,323,718 B1
DATED : November 27, 2001
INVENTOR(S) : Pierre Rault and Eric Bernier It is certified that error appears in the above-identified patent and that said Letters Patent is hereby corrected as shown below:

<u>Title page,</u>
Item [30], U.S. 6,323,718 should read:
-- [30] Foreign Application Priority Data
Dec. 22, 1997 (FR).....................................97 16640 --

Signed and Sealed this

Sixteenth Day of April, 2002

Attest:

JAMES E. ROGAN
*Attesting Officer*     *Director of the United States Patent and Trademark Office*